United States Patent
Dao et al.

(10) Patent No.: US 9,584,118 B1
(45) Date of Patent: Feb. 28, 2017

(54) SUBSTRATE BIAS CIRCUIT AND METHOD FOR BIASING A SUBSTRATE

(71) Applicant: FREESCALE SEMICONDUCTOR, INC., Austin, TX (US)

(72) Inventors: Chris C. Dao, Pflugerville, TX (US); Stefano Pietri, Austin, TX (US); Juxiang Ren, Austin, TX (US); Robert S. Ruth, Austin, TX (US)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 14/836,223

(22) Filed: Aug. 26, 2015

(51) Int. Cl.
*H03K 17/687* (2006.01)

(52) U.S. Cl.
CPC .............. *H03K 17/6872* (2013.01)

(58) Field of Classification Search
CPC ..... G05F 3/205; G11C 5/146; H03K 17/6872; H03K 19/0027; H03K 2217/0018
See application file for complete search history.

(56) References Cited

U.S. PATENT DOCUMENTS

| | | | |
|---|---|---|---|
| 4,890,011 A | 12/1989 | Miyatake | |
| 5,444,362 A | 8/1995 | Chung et al. | |
| 5,912,571 A | 6/1999 | Li et al. | |
| 6,218,895 B1 | 4/2001 | De et al. | |
| 6,285,213 B1* | 9/2001 | Makino | H03K 3/356008 326/81 |
| 6,465,849 B1 | 10/2002 | Chang et al. | |
| 6,559,708 B2* | 5/2003 | Notani | H03K 19/0016 327/534 |
| 7,295,040 B1* | 11/2007 | Nguyen | H03K 19/00315 326/68 |
| 7,330,049 B2* | 2/2008 | Perisetty | H01L 27/0921 257/E27.063 |
| 7,504,877 B1 | 3/2009 | Voogel et al. | |
| 7,920,019 B2 | 4/2011 | Bertram et al. | |
| 8,085,084 B2 | 12/2011 | Fu et al. | |
| 8,314,647 B2 | 11/2012 | Shimizu et al. | |
| 8,330,530 B2 | 12/2012 | Homol et al. | |
| 8,710,906 B1 | 4/2014 | Jarrar et al. | |

FOREIGN PATENT DOCUMENTS

| | | |
|---|---|---|
| CA | 2243375 A1 | 1/2000 |
| EP | 1832951 A2 | 12/2007 |

OTHER PUBLICATIONS

Pietri et al, "Reverse bias techniques for high-end automotive MCU's" EDN Asia, Jun. 4, 2015, pp. 1-6.
Extended European Search Report dated Jan. 16, 2017 from EP Application No. 16181553.5.

* cited by examiner

*Primary Examiner* — Jeffrey Zweizig

(57) ABSTRACT

A substrate bias circuit and method for biasing a substrate are provided. A substrate bias circuit includes a first voltage source, a second voltage source, a diode coupled between the first voltage source and the second voltage source, and a plurality of transistors, each transistor in the plurality of transistors having a substrate terminal. In one example, the first voltage source supplies, via the diode, the substrate terminal of a first transistor of the plurality of transistors during a power-up, and the second voltage source supplies the substrate terminal of the first transistor after the power-up.

19 Claims, 2 Drawing Sheets

SUBSTRATE BIAS CIRCUIT AND METHOD FOR BIASING A SUBSTRATE

BACKGROUND

Field

This disclosure relates generally to circuits, and more specifically, to a substrate bias circuit and method for biasing a substrate.

Related Art

In integrated circuits that have CMOS (complementary metal oxide semiconductor) transistors, a body, or well, terminal of the P-channel transistors is typically connected to a positive supply and the body terminal of the N-channel transistors is typically connected to ground. In some CMOS circuits a technique called reverse back biasing may be used to change transistor threshold voltages to reduce leakage current and thus reduce power consumption. However, during power-up of an integrated circuit configured to provide reverse back biasing, if the well bias is applied after the power supply voltage is applied, a condition may exist that creates an undesirable current path through series-connected N-channel and P-channel transistors. The condition may lead to excessive current consumption, and in high temperature cases, may result in latch-up of the integrated circuit.

Therefore, a need exists to prevent excessive current and possibly latch-up in an integrated circuit during power-up.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
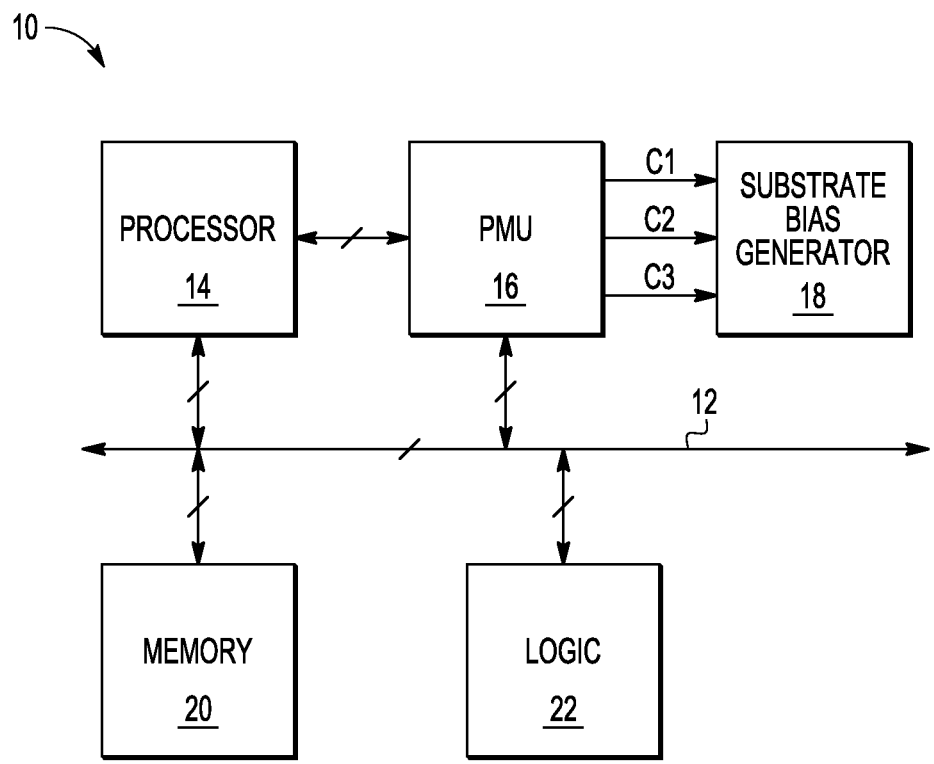
FIG. 1 illustrates, in block diagram form, an integrated circuit in accordance with an embodiment.

Generally, there is provided, a substrate bias circuit that provides reverse back biasing for transistors of an integrated circuit. In one embodiment, the integrated circuit includes an N-well for P-channel transistors and a P-well for N-channel transistors. Instead of coupling the N-well and P-well terminals to the power supply and ground, respectively, the N-well and P-well terminals are reverse back biased by the substrate bias circuit. The substrate bias circuit provides reverse back biasing by providing a voltage greater than the power supply voltage to the N-well and a voltage lower than ground to the P-well. The substrate bias circuit includes a depletion N-channel transistor that is diode-connected between a power supply voltage terminal and the substrate, or body, terminals of the P-channel transistors in the N-well. The substrate bias circuit also includes back-to-back diode-connected transistors connected between ground and the P-well substrate terminals of the N-channel transistors. The diode-connected transistors prevent a latch-up condition that may occur during power-up by coupling the substrate terminals to power supply terminals if the power supply voltages increase before the substrate bias generator can properly bias the substrate terminals.

In one embodiment, there is provided, a substrate bias circuit comprising: a first voltage source; a plurality of transistors, each transistor in the plurality of transistors having a substrate terminal; a second voltage source coupled to the substrate terminal of a first transistor in the plurality of transistors; and a first diode coupled between the first voltage source and the second voltage source. The first voltage source may be coupled to a current electrode of the first transistor in the plurality of transistors. The first diode may comprise a diode-connected natural NMOS transistor. The second voltage source may comprise a voltage regulator. The plurality of transistors may be arranged in a logic gate. The plurality of transistors may be arranged in a memory cell, and wherein the first voltage source is coupled to a current electrode of a transistor in the memory cell. The substrate bias circuit may further comprise: a third voltage source; a fourth voltage source coupled to the substrate terminal of a second transistor in the plurality of transistors; and a second diode coupled between the third voltage source and the fourth voltage source. The second diode may comprise transistors connected in a back-to-back diode configuration. The fourth voltage source may comprise a charge pump. The first transistor in the plurality of transistors is characterized as a PMOS transistor and the second transistor in the plurality is characterized as an NMOS transistor. The third voltage source may be coupled to a current electrode of the second transistor in the plurality of transistors.

In another embodiment, there is provided, a substrate bias circuit comprising: a first voltage source; a plurality of transistors; a second voltage source coupled to a substrate terminal of a first transistor in the plurality of transistors; a first diode coupled between the first voltage source and the second voltage source; a third voltage source; a fourth voltage source coupled to a substrate terminal of a second transistor in the plurality of transistors; and a second diode coupled between the third voltage source and the fourth voltage source. The first voltage source may be coupled to a current electrode of the first transistor in the plurality of transistors and the third voltage source may be coupled to a current electrode of the second transistor in the plurality of transistors. The first diode may comprise a diode connected natural NMOS transistor. The second diode may comprise back-to-back series diode-connected NMOS transistors. The second diode may be one of a plurality of diodes coupled between the third voltage source and the fourth voltage source. The second voltage source may have a higher voltage than the first voltage source during a normal operating mode.

In yet another embodiment, there is provided, a method for biasing a substrate, the method comprising: coupling, via a first diode, a first voltage source to a substrate terminal of a first transistor; and coupling a second voltage source to the substrate terminal of the first transistor; wherein the first voltage source supplies the substrate terminal of the first transistor during power-up, and the second voltage source supplies the substrate terminal of the first transistor after power-up. The method may further comprise coupling the first voltage source to a current electrode of the first transistor, wherein the first voltage source provides a first voltage and the second voltage source provides a second voltage, the second voltage different than the first voltage. The first diode may comprise a natural NMOS transistor connected in a diode configuration, coupling an anode terminal of the first diode to the first voltage source and the cathode terminal of the first diode to the substrate of the first transistor.

FIG. 1 illustrates, in block diagram form, integrated circuit 10 in accordance with an embodiment. Integrated circuit 10 may be implemented using a CMOS process having P-channel transistors in an N-Well and N-channel transistors in a P-Well. In one embodiment, integrated circuit 10 is a system-on-a-chip (SoC). Integrated circuit 10 includes bus 12, processor 14, power management unit (PMU) 16, substrate bias generator 18, memory 20, and logic 22. Processor 14, PMU 16, memory 20, and logic 22 are all bi-directionally connected to bus 12. Bus 12 can be any type of bus for communicating any type of information such as data, address, or instructions. Processor 14 may be any type of processor such as a microprocessor (MPU), microcontroller (MCU), digital signal processor (DSP), or other type of processing core. There may be multiple processors like processor 14. Memory 20 may be any type of volatile or non-volatile memory, such as static random access memory (SRAM), dynamic random access memory (DRAM), flash, etc. Memory 20 may also be connected directly to processor 14. Power management unit 16 has outputs for providing control signals including control signals C1, C2, and C3 to substrate bias generator 18. Logic 22 includes circuits for providing specific functionality to integrated circuit 10. Logic 22 may predominately comprise logic such as AND, OR, NAND, NOR, exclusive OR, exclusive NOR, inverters and other types of logic gates. Many of the logic gates will have series-connected transistors as in circuit portion 30. With respect to some integrated circuits, logic 22 may occupy most of the surface area and there may be more than one substrate bias generator 18 because of the large wells. Logic 22 may also be referred to as a sea-of-gates (SoG).

For integrated circuits manufactured at semiconductor processing nodes of 55 nm (nanometer) feature size and smaller, leakage current between the source and drain terminals of the transistors becomes more of a problem, especially in very large integrated circuits having a large number of transistors. Metal oxide semiconductor (MOS) transistors are characterized as being four terminal devices having a gate, drain, source and substrate terminal. One way to reduce leakage current in a MOS transistor is to independently bias the substrate terminals of the transistors with a reverse body bias instead of coupling the substrate terminals to the corresponding power supply terminals. Substrate bias circuit 18 provides the reverse body bias under the control of PMU 16. Substrate bias circuit 18 also protects against latch-up. The term "substrate" is defined to be doped or undoped bulk semiconductor material, an N-well in the case of P-channel transistors, a P-well in the case of N-channel transistors, or any type of active semiconductor material in which transistors are formed. Substrate terminals of transistors may also be referred to as body terminals, body ties, or the like.

Figure 2:
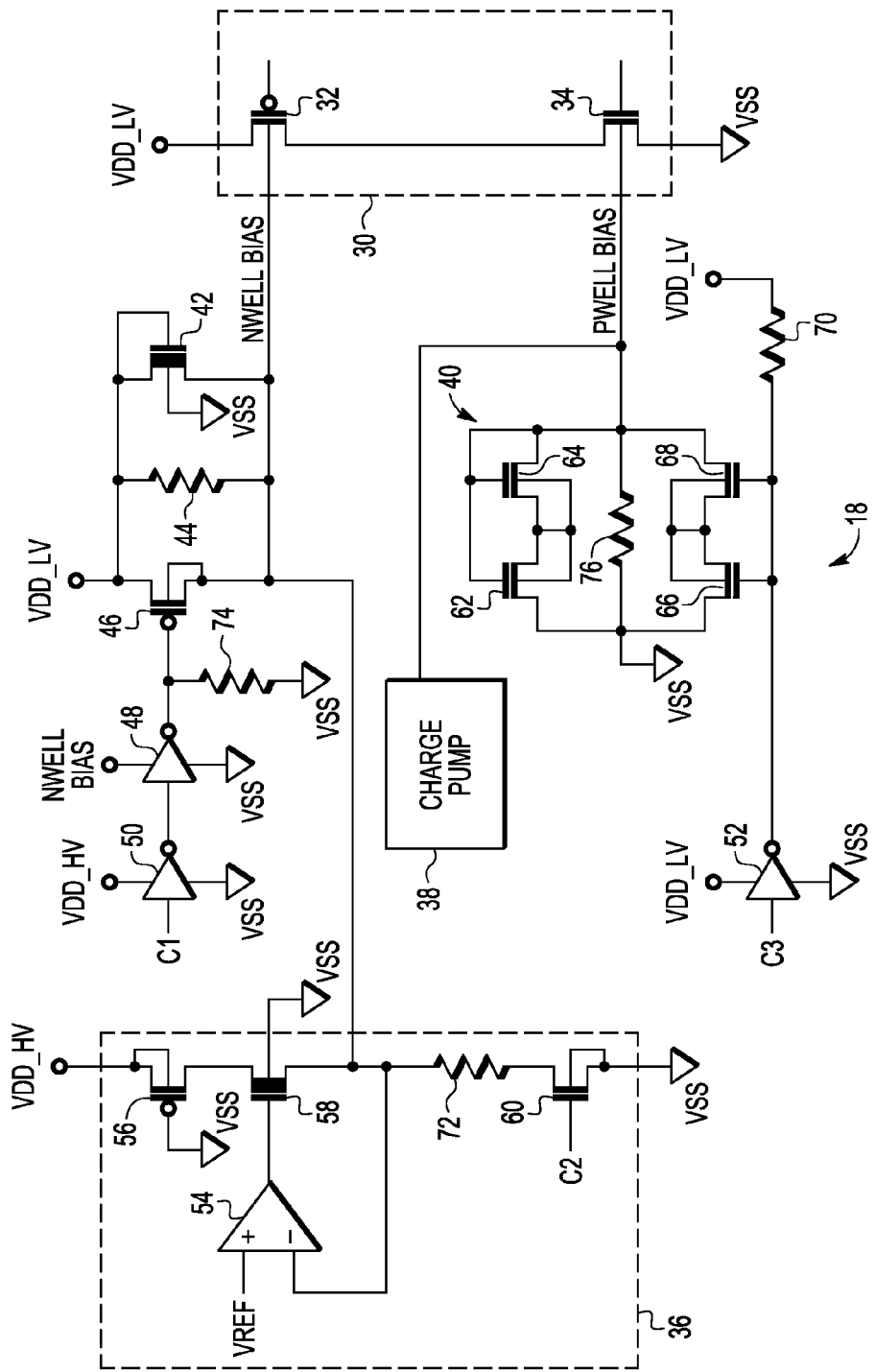
FIG. 2 illustrates, in schematic diagram form, the substrate bias circuit of FIG. 1 in more detail.

FIG. 2 illustrates, in schematic diagram form, substrate bias circuit 18 in more detail. Substrate bias circuit 18 is shown connected to a circuit portion 30. Circuit portion 30 is an example portion of logic 22, but may be any circuit portion of integrated circuit 10. Circuit portion 30 includes series-connected P-channel transistor 32 and N-channel transistor 34 connected between a low voltage power supply voltage terminal labeled "VDD_LV". Logic 22 may include many logic gates that have transistors connected similarly to circuit portion 30, such as for example, an inverter circuit. In another embodiment, circuit portion 30 may be part of a memory cell, such as a static random access memory (SRAM) cell.

Substrate bias circuit 18 includes voltage regulator 36, charge pump 38, back-to-back diodes 40, diode-connected transistor 42, transistor 46, resistors 44, 70, 74, and 76, and inverters 48, 50, and 52. Voltage regulator 36 can be any conventional regulator that will supply a voltage higher than an input voltage, such as VDD_LV. In the illustrate embodiment, voltage regulator 36 includes error amplifier 54, P-channel transistor 56, depletion N-channel transistor 58, N-channel transistor 60, and resistor 72. Charge pump 38 can be any type of conventional charge pump for providing a negative voltage, or a voltage below ground potential to the substrate terminals of the N-channel transistors such as N-channel transistor 34. Back-to-back diodes 40 includes N-channel transistors 62, 64, 66, and 68.

In the illustrated embodiment, low voltage power supply voltage terminal VDD_LV is coupled to receive 1.25 volts, high voltage power supply voltage terminal VDD_HV is coupled to receive 5 volts, and VSS is coupled to ground potential. In other integrated circuits, the power supply voltages may be different.

In regulator 36, P-channel transistor 56 has a source (current electrode) connected to a high voltage power supply voltage terminal labeled "VDD_HV", a gate (control electrode) connected to a power supply voltage terminal labeled "VSS", a drain (current electrode), and a substrate terminal connected to power supply voltage terminal VDD_HV. Depletion N-channel transistor 58 has a drain connected to the drain of P-channel transistor 56, a gate, a substrate terminal connected to power supply voltage terminal VSS, and a source connected to provide a substrate bias voltage labeled N-WELL BIAS to the substrate terminals of the P-channel transistors of logic 22, such as P-channel transistor 32. The terms "depletion", "natural", and "native" all refer to a zero threshold voltage transistor. Resistor 72 has a first terminal connected to the source of N-channel transistor 58, and a second terminal. N-channel transistor 60 has a drain connected to the second terminal of resistor 72, a gate for receiving control signal C2, and a source connected to power supply voltage terminal VSS. Error amplifier 54 has a first input terminal for receiving a reference voltage labeled "VREF", second input terminal connected to the source of N-channel transistor 58, and an output terminal connected to the gate of depletion N-channel transistor 58.

Depletion N-channel transistor 42 has a gate and drain connected to VDD_LV, a source connected to N-WELL BIAS, and a substrate terminal connected to VSS. Resistor 44 has a first terminal connected to VDD_LV, and a second terminal connected to the substrate terminal of transistor 32. P-channel transistor 46 has a drain connected to VDD_LV, a gate, and a drain and substrate terminal connected to the substrate terminal of transistor 32. Inverter 48 has an input terminal, an output terminal connected to the gate of transistor 46, a first supply terminal connected to N-WELL BIAS, and a second supply voltage connected to VSS. Voltage regulator 36 provides a voltage higher than VDD_LV to the substrate terminals of P-channel transistors. Resistor 74 has a first terminal connected to the gate of transistor 46, and a second terminal connected to VSS. Inverter 50 has an input terminal coupled to receive control signal C1, an output terminal connected to the input terminal of inverter 48, a first supply terminal connected to VDD_HV, and a second supply terminal connected to VSS.

In back-to-back diode-connected transistors 40, N-channel transistor 62 has a first drain/source terminal connected to VSS, a second drain/source terminal, and a gate connected to the substrate terminal of N-channel transistor 34. N-channel transistor 64 has a first drain/source terminal connected to the second drain/source terminal of transistor 62, a gate connected to the gate of transistor 62 and to the substrate terminal of transistor 34, and a second drain/source terminal connected to the substrate terminal of N-channel transistor 34. Substrate terminals of transistors 62 and 64 are connected together and to a common connection between transistors 62 and 64. Resistor 76 has a first terminal connected to VSS, and a second terminal connected to the substrate terminal of transistor 34. N-channel transistor 66 has a first drain/source terminal connected to VSS, a gate, and a second drain/source terminal. N-channel transistor 68 has a first drain/source terminal connected to the second drain/source terminal of transistor 66, a gate connected to the gate of transistor 66, and a second drain/source terminal connected to the substrate terminal of transistor 34. Substrate terminals of transistors 66 and 68 are connected together and to the drain/source connected between transistors 66 and 68. Resistor 70 has a first terminal connected to VDD_LV, and a second terminal connected to the gates of transistors 66 and 68. Inverter 52 has an input terminal for receiving control signal C3, and an output terminal connected to the gates of transistors 66 and 68.

Prior to power-up N-wells and P-wells may be discharged and may be at ground potential. Charging the N-wells can take time because they may be heavily loaded with a large number of transistors. For the N-wells to charge faster, a lower resistive path is needed to VDD_LV. To provide a lower resistive path, the number of devices used for charging the wells, such as transistor 42, resistor 44, and transistor 46, should be determined according to the size of the N-wells and the number of transistors in the N-wells.

During power-up of integrated circuit 10, if power comes up, or increases, to VDD_LV before the supplies that bias the N-wells and P-wells of circuit portion 30, the substrate terminals of transistors 32 and 34 may float. To prevent having floating substrate terminals in the N-well during power-up, a MOS switch, such as transistor 46 in FIG. 2, is provided. However, during power-up, Transistor 46 may be either off or very resistive when the core supply voltage (VDD_LV) is still very low and below the MOS threshold voltage and may not prevent the substrate terminal of transistor 32 from floating. Depletion diode-connected transistor 42 is used to provide a low DC resistive path during power-up when the core supply voltage is still very low and transistor 46 has not yet become conductive. Using a zero threshold voltage (VT) device for diode 42 allows diode 42 to turn on as quickly as possible during power-up. After power-up and during a normal operating mode when integrated circuit 10 is operating in reverse back bias mode, transistor 42 is turned off and its off-resistance is relatively large as compared to its on-resistance thus presenting a lighter load to substrate bias generator 18. Likewise, back-to-back diodes 40 prevent P-WELL BIAS from forward biasing parasitic diodes in N-channel transistor 34 to create a current path during power-up.

Power-up of integrated circuit 10 refers to the steps required to apply one or more power supply voltages to integrated circuit 10. At the beginning of a power-up sequence, regulator 36 begins to power up and charge N-WELL BIAS and charge pump 38 begins to discharge P-WELL BIAS to below ground potential. However, it takes time to charge and discharge the P and N wells, respectively. To prevent a latch-up condition during power-up, control signal C1 is asserted as a low voltage, or a logic zero. The logic zero C1 causes P-channel transistor 46 to be conductive and the voltage at N-WELL BIAS increases. The logic high control signal C3 causes N-channel transistors 66 and 68 to be conductive, thus pulling P-WELL BIAS to ground potential. Additionally resistor 44 and transistor 72 contribute to charging as described above. After power-up, control signal C1 is negated as a logic high and C3 is negated as a logic low causing P-channel transistor 46 and N-channel transistors 66 and 68 to be non-conductive. Control signal C2 is asserted after power-up, and after the reference voltage VREF is accurate, as a logic high to cause N-channel transistor 60 to be conductive. Transistor 60 adds stability to voltage regulator 36. Voltage regulator 36 provides N-WELL BIAS higher than VDD-LV and charge pump 38 pumps P-WELL BIAS to below ground. This provides a reverse back bias for the transistors of logic 22.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A substrate bias circuit comprising:
   a first voltage source;
   a plurality of transistors, each transistor in the plurality of transistors having a substrate terminal;
   a second voltage source coupled to the substrate terminal of a first transistor in the plurality of transistors, the second voltage source comprising a voltage regulator; and
   a first diode having an anode terminal connection to the first voltage source and a cathode terminal connection to the second voltage source.

2. The substrate bias circuit of claim 1, wherein the first voltage source is coupled to a current electrode of the first transistor in the plurality of transistors.

3. The substrate bias circuit of claim 1, wherein the first diode comprises a diode-connected natural NMOS transistor.

4. The substrate bias circuit of claim 1, wherein the plurality of transistors is arranged in a logic gate.

5. The substrate bias circuit of claim 1, wherein the plurality of transistors is arranged in a memory cell, and wherein the first voltage source is coupled to a current electrode of a transistor in the memory cell.

6. The substrate bias circuit of claim 1, further comprising:
   a third voltage source;
   a fourth voltage source coupled to the substrate terminal of a second transistor in the plurality of transistors; and
   a second diode coupled between the third voltage source and the fourth voltage source.

7. The substrate bias circuit of claim 6, wherein the second diode comprises transistors connected in a back-to-back diode configuration.

8. The substrate bias circuit of claim 6, wherein the fourth voltage source comprises a charge pump.

9. The substrate bias circuit of claim 6, wherein the first transistor in the plurality is characterized as a PMOS transistor and the second transistor in the plurality is characterized as an NMOS transistor.

10. The substrate bias circuit of claim 6, wherein the third voltage source is coupled to a current electrode of the second transistor in the plurality.

11. A substrate bias circuit comprising:
    a first voltage source;
    a plurality of transistors;
    a second voltage source coupled to a substrate terminal of a first transistor in the plurality of transistors, the second voltage source comprising a voltage regulator;
    a first diode having an anode terminal connection to the first voltage source and a cathode terminal connection to the second voltage source;
    a third voltage source;
    a fourth voltage source coupled to a substrate terminal of a second transistor in the plurality of transistors; and
    a second diode coupled between the third voltage source and the fourth voltage source.

12. The substrate bias circuit of claim 11, wherein the first voltage source is coupled to a current electrode of the first transistor in the plurality and the third voltage source is coupled to a current electrode of the second transistor in the plurality of transistors.

13. The substrate bias circuit of claim 11, wherein the first diode comprises a diode connected natural NMOS transistor.

14. The substrate bias circuit of claim 11, wherein the second diode comprises back-to-back series diode-connected NMOS transistors.

15. The substrate bias circuit of claim 11, wherein the second diode is one of a plurality of diodes coupled between the third voltage source and the fourth voltage source.

16. The substrate bias circuit of claim 11, wherein the second voltage source has a higher voltage than the first voltage source during a normal operating mode.

17. A method for biasing a substrate, the method comprising:
    coupling, via a first diode, a first voltage source to a substrate terminal of a first transistor, the first diode having an anode terminal connection to the first voltage source and a cathode terminal connection to a second voltage source, the second voltage source comprising a voltage regulator; and
    coupling the second voltage source to the substrate terminal of the first transistor;
    wherein the first voltage source supplies the substrate terminal of the first transistor during power-up, and the second voltage source supplies the substrate terminal of the first transistor after power-up.

18. The method of claim 17, further comprising coupling the first voltage source to a current electrode of the first transistor, wherein the first voltage source provides a first voltage and the second voltage source provides a second voltage, the second voltage different than the first voltage.

19. The method of claim 17, wherein the first diode comprises natural NMOS transistor connected in a diode configuration.

* * * * *